US012394686B2

(12) United States Patent
Chang et al.

(10) Patent No.: US 12,394,686 B2
(45) Date of Patent: Aug. 19, 2025

(54) SEMICONDUCTOR STRUCTURE AND MANUFACTURING METHOD THEREOF

(71) Applicant: Powerchip Semiconductor Manufacturing Corporation, Hsinchu (TW)

(72) Inventors: Shou-Zen Chang, Hsinchu (TW); Chun-Lin Lu, Hsinchu (TW); Ming-Han Liao, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 390 days.

(21) Appl. No.: 18/304,328

(22) Filed: Apr. 20, 2023

(65) Prior Publication Data

US 2024/0332111 A1    Oct. 3, 2024

(30) Foreign Application Priority Data

Mar. 31, 2023   (TW) .................................. 112112555

(51) Int. Cl.
*H01L 23/34*      (2006.01)
*H01L 23/00*      (2006.01)
(Continued)

(52) U.S. Cl.
CPC ............ *H01L 23/34* (2013.01); *H01L 23/481* (2013.01); *H01L 23/49816* (2013.01);
(Continued)

(58) Field of Classification Search
CPC . H01L 23/34; H01L 23/481; H01L 23/49816; H01L 23/49822; H01L 23/3677;
(Continued)

(56) References Cited

U.S. PATENT DOCUMENTS

2017/0213821 A1    7/2017   Or-Bach et al.
2021/0375829 A1    12/2021  Or-Bach et al.
(Continued)

FOREIGN PATENT DOCUMENTS

WO    2023049132    3/2023

OTHER PUBLICATIONS

"Office Action of Taiwan Counterpart Application", issued on Apr. 9, 2024, p. 1-p. 6.

*Primary Examiner* — Dao H Nguyen
(74) *Attorney, Agent, or Firm* — JCIPRNET

(57) ABSTRACT

A semiconductor structure including a device wafer, a carrier structure, and a redistribution layer (RDL) structure is provided. The device wafer includes a first substrate, a first dielectric layer, first bonding pads, and a power via structure. The carrier structure includes the following components. A second substrate has a third surface and a fourth surface opposite to each other. A second dielectric layer is located on the third surface. Second bonding pads are located in the second dielectric layer. The second bonding pads are bonded to the first bonding pad, and the second dielectric layer is bonded to the first dielectric layer. A heat dissipation plate is located on the fourth surface. Through-substrates via (TSVs) pass through the second substrate. The TSV is electrically connected to the heat dissipation plate and the second bonding pad. The RDL structure is electrically connected to the power via structure.

20 Claims, 15 Drawing Sheets

(51) Int. Cl.
  *H01L 23/48* (2006.01)
  *H01L 23/498* (2006.01)
(52) U.S. Cl.
  CPC ........ *H01L 23/49822* (2013.01); *H01L 24/08* (2013.01); *H01L 24/80* (2013.01); *H01L 2224/08225* (2013.01); *H01L 2224/80895* (2013.01); *H01L 2224/80896* (2013.01)
(58) Field of Classification Search
  CPC ....... H01L 23/488; H01L 23/49; H01L 24/08; H01L 24/80; H01L 24/05; H01L 2224/08225; H01L 2224/80895; H01L 2224/80896; H01L 21/50; H01L 25/162
  See application file for complete search history.

(56) References Cited

U.S. PATENT DOCUMENTS

| | | | |
|---|---|---|---|
| 2022/0262766 A1* | 8/2022 | Chen | H01L 25/0652 |
| 2022/0285233 A1* | 9/2022 | Li | H01L 22/14 |
| 2023/0389324 A1* | 11/2023 | Chen | H01L 23/5283 |
| 2024/0194717 A1* | 6/2024 | Lee | H10F 39/807 |
| 2025/0210465 A1* | 6/2025 | Chen | H01L 21/56 |

* cited by examiner

SEMICONDUCTOR STRUCTURE AND MANUFACTURING METHOD THEREOF

CROSS-REFERENCE TO RELATED APPLICATION

This application claims the priority benefit of Taiwanese application no. 112112555, filed on Mar. 31, 2023. The entirety of the above-mentioned patent application is hereby incorporated by reference herein and made a part of this specification.

BACKGROUND

Technical Field

The invention relates to a semiconductor structure and a manufacturing method thereof, and particularly relates to a semiconductor structure capable of improving heat dissipation performance and a manufacturing method thereof.

Description of Related Art

Currently, the backside power delivery network has been developed. Therefore, the power circuit and the signal circuit in the semiconductor structure can be separated, thereby reducing the complexity of the circuit design and improving the performance of the semiconductor structure. However, the semiconductor structure with the backside power delivery network has poor heat dissipation performance. Therefore, how to improve the heat dissipation performance of the semiconductor structure with the backside power delivery network is the goal of continuous efforts.

SUMMARY

The invention provides a semiconductor structure and a manufacturing method thereof, which can effectively improve the heat dissipation performance of the semiconductor structure.

The invention provides a semiconductor structure, which includes a device wafer, a carrier structure, and a redistribution layer (RDL) structure. The device wafer includes a first substrate, a first dielectric layer, first bonding pads, and a power via structure. The first substrate has a first surface and a second surface opposite to each other. The first dielectric layer is located on the first surface. The first bonding pads are located in the first dielectric layer. The power via structure passes through the first substrate. The carrier structure includes a second substrate, a second dielectric layer, second bonding pads, a heat dissipation plate, and through-substrate vias (TSVs). The second substrate has a third surface and a fourth surface opposite to each other. The second dielectric layer is located on the third surface. The second bonding pads are located in the second dielectric layer. The second bonding pads are bonded to the first bonding pads, and the second dielectric layer is bonded to the first dielectric layer. The heat dissipation plate is located on the fourth surface. The TSVs pass through the second substrate. Each of the TSVs is electrically connected to the heat dissipation plate and the corresponding second bonding pad. The RDL structure is located on the second surface. The RDL structure is electrically connected to the power via structure.

According to an embodiment of the invention, in the semiconductor structure, the carrier structure may further include an integrated passive device (IPD). The integrated passive device is located in the second dielectric layer. The integrated passive device may be electrically connected to one of the second bonding pads.

According to an embodiment of the invention, in the semiconductor structure, the carrier structure may further include a third dielectric layer. The third dielectric layer is located on the fourth surface. The heat dissipation plate is located in the third dielectric layer.

According to an embodiment of the invention, in the semiconductor structure, the third dielectric layer may completely cover the heat dissipation plate.

According to an embodiment of the invention, in the semiconductor structure, the third dielectric layer may expose the heat dissipation plate.

According to an embodiment of the invention, in the semiconductor structure, the power via structure may be a multilayer structure.

According to an embodiment of the invention, in the semiconductor structure, the power via structure may be a single-layer structure.

According to an embodiment of the invention, in the semiconductor structure, the TSVs may be directly connected to the heat dissipation plate.

According to an embodiment of the invention, in the semiconductor structure, the TSVs may be directly connected to the second bonding pads.

According to an embodiment of the invention, in the semiconductor structure, the device wafer may further include an interconnect structure. The interconnect structure is located in the first dielectric layer. The interconnect structure may be electrically connected to the power via structure. The interconnect structure may be electrically connected to the first bonding pads.

According to an embodiment of the invention, in the semiconductor structure, the RDL structure may include a third dielectric layer, an RDL, a pad, and an integrated passive device. The third dielectric layer is located on the second surface. The RDL is located in the third dielectric layer. The RDL may be electrically connected to the power via structure. The pad is located in the third dielectric layer. The pad may be electrically connected to the RDL. The integrated passive device is located in the third dielectric layer. The integrated passive device may be electrically connected to the RDL.

According to an embodiment of the invention, the semiconductor structure may further include a connection terminal. The connection terminal is located on the RDL structure. The connection terminal may be electrically connected to the pad.

According to an embodiment of the invention, the semiconductor structure may further include an under-bump metallurgy (UBM). The UBM is located between the connection terminal and the pad.

The invention provides a manufacturing method of a semiconductor structure, which includes the following steps. A device wafer is formed. The device wafer includes a first substrate, a first dielectric layer, first bonding pads, and a power via structure. The first substrate has a first surface and a second surface opposite to each other. The first dielectric layer is located on the first surface. The first bonding pads are located in the first dielectric layer. The power via structure passes through the first substrate. A carrier structure is formed above the first surface. The carrier structure includes a second substrate, a second dielectric layer, second bonding pads, a heat dissipation plate, and TSVs. The second substrate has a third surface and a fourth surface opposite to each other. The second dielectric layer is located on the third surface. The second bonding pads are located in the second dielectric layer. The second bonding pads are bonded to the first bonding pads, and the second dielectric layer is bonded to the first dielectric layer. The heat dissipation plate is located on the fourth surface. The TSVs pass through the second substrate. Each of the TSVs is electrically connected to the heat dissipation plate and the corresponding second bonding pad. An RDL structure is formed above the second surface. The RDL structure is electrically connected to the power via structure.

According to an embodiment of the invention, in the manufacturing method of the semiconductor structure, the carrier structure may further include an integrated passive device. The integrated passive device is located in the second dielectric layer. The integrated passive device may be electrically connected to one of the second bonding pads.

According to an embodiment of the invention, in the manufacturing method of the semiconductor structure, the method of bonding the second bonding pads to the first bonding pads and bonding the second dielectric layer to the first dielectric layer is, for example, a hybrid bonding method.

According to an embodiment of the invention, in the manufacturing method of the semiconductor structure, the heat dissipation plate may be formed first, and then the RDL structure may be formed.

According to an embodiment of the invention, in the manufacturing method of the semiconductor structure, the RDL structure may be formed first, and then the heat dissipation plate may be formed.

According to an embodiment of the invention, in the manufacturing method of the semiconductor structure, the RDL structure may include a third dielectric layer, an RDL, a pad, and an integrated passive device. The third dielectric layer is located on the second surface. The RDL is located in the third dielectric layer. The RDL may be electrically connected to the power via structure. The pad is located in the third dielectric layer. The pad may be electrically connected to the RDL. The integrated passive device is located in the third dielectric layer. The integrated passive device may be electrically connected to the RDL.

According to an embodiment of the invention, the manufacturing method of the semiconductor structure may further include the following step. A connection terminal is formed on the RDL structure. The connection terminal may be electrically connected to the pad.

Based on the above description, in the semiconductor structure and the manufacturing method thereof according to the invention, the second bonding pads are bonded to the first bonding pads, the TSVs pass through the second substrate, and each of the TSVs is electrically connected to the heat dissipation plate and the corresponding second bonding pad. Therefore, the heat dissipation performance of the semiconductor structure can be effectively improved by the heat dissipation plate. In some embodiments, the heat dissipation plate can be used as a power line, thereby improving the circuit design flexibility and the circuit performance.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 2A:
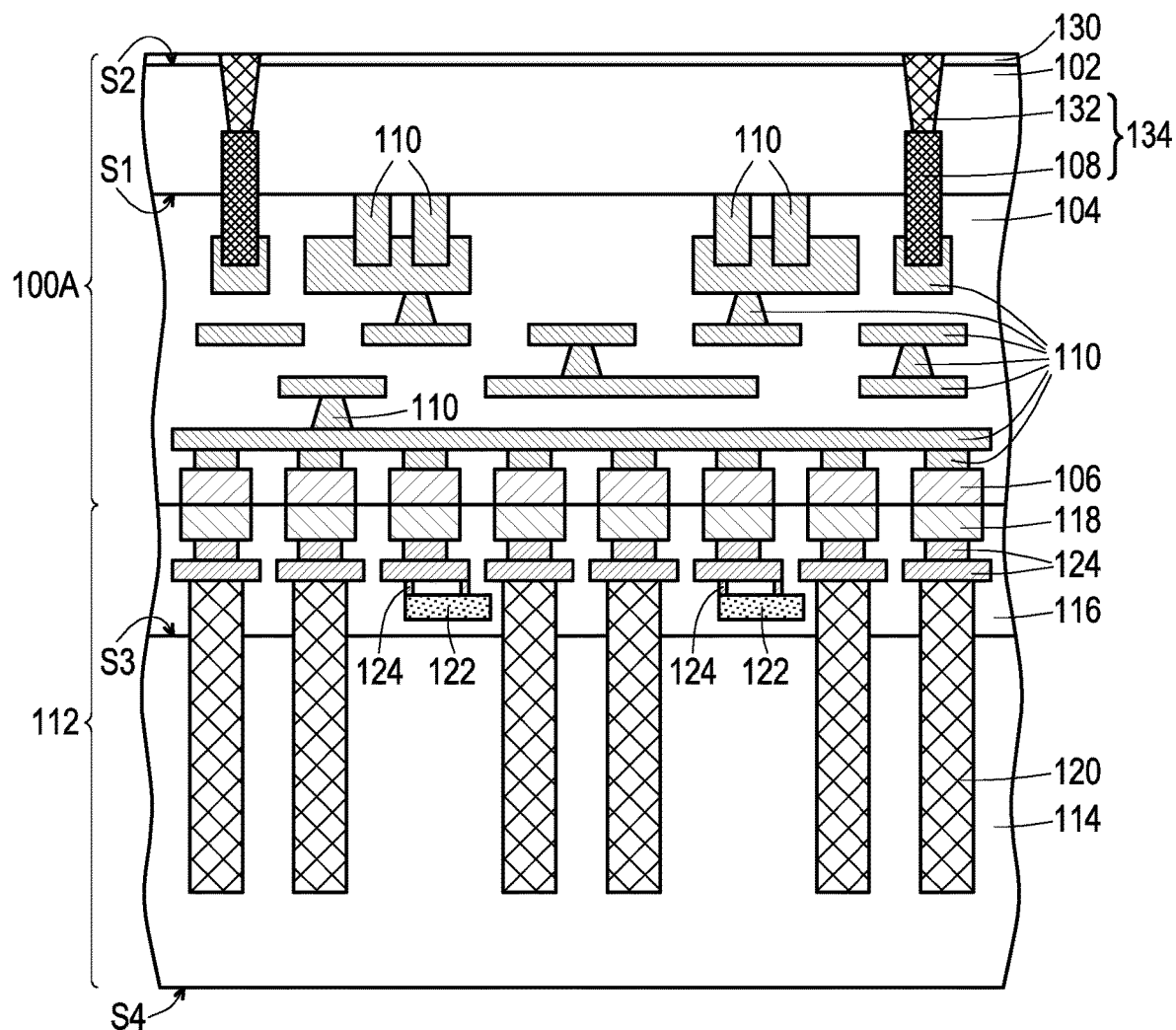
FIG. 2A to FIG. 2F are cross-sectional views of a manufacturing process of a semiconductor structure according to other embodiments of the invention.
Figure 2B:
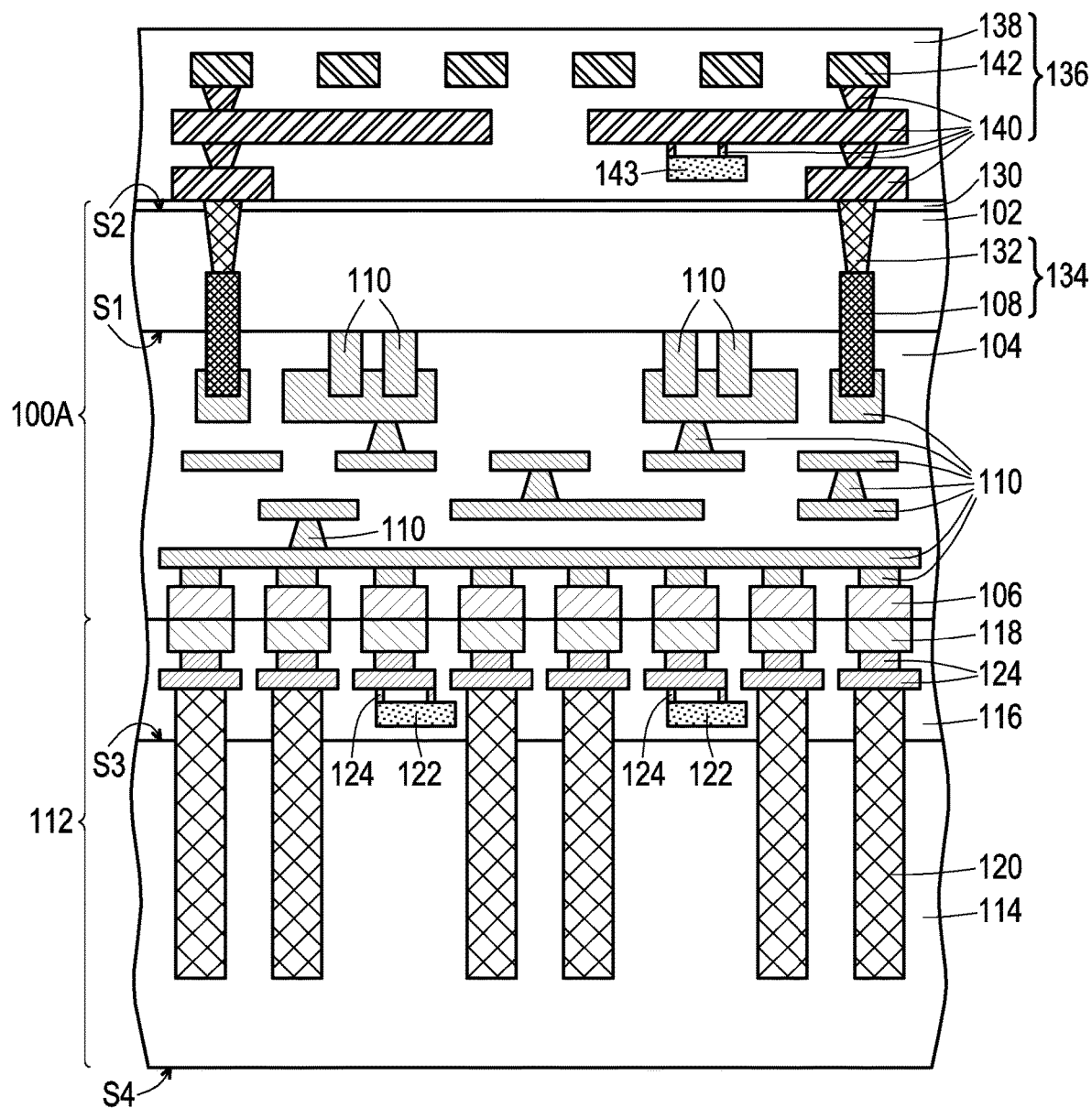
Figure 2C:
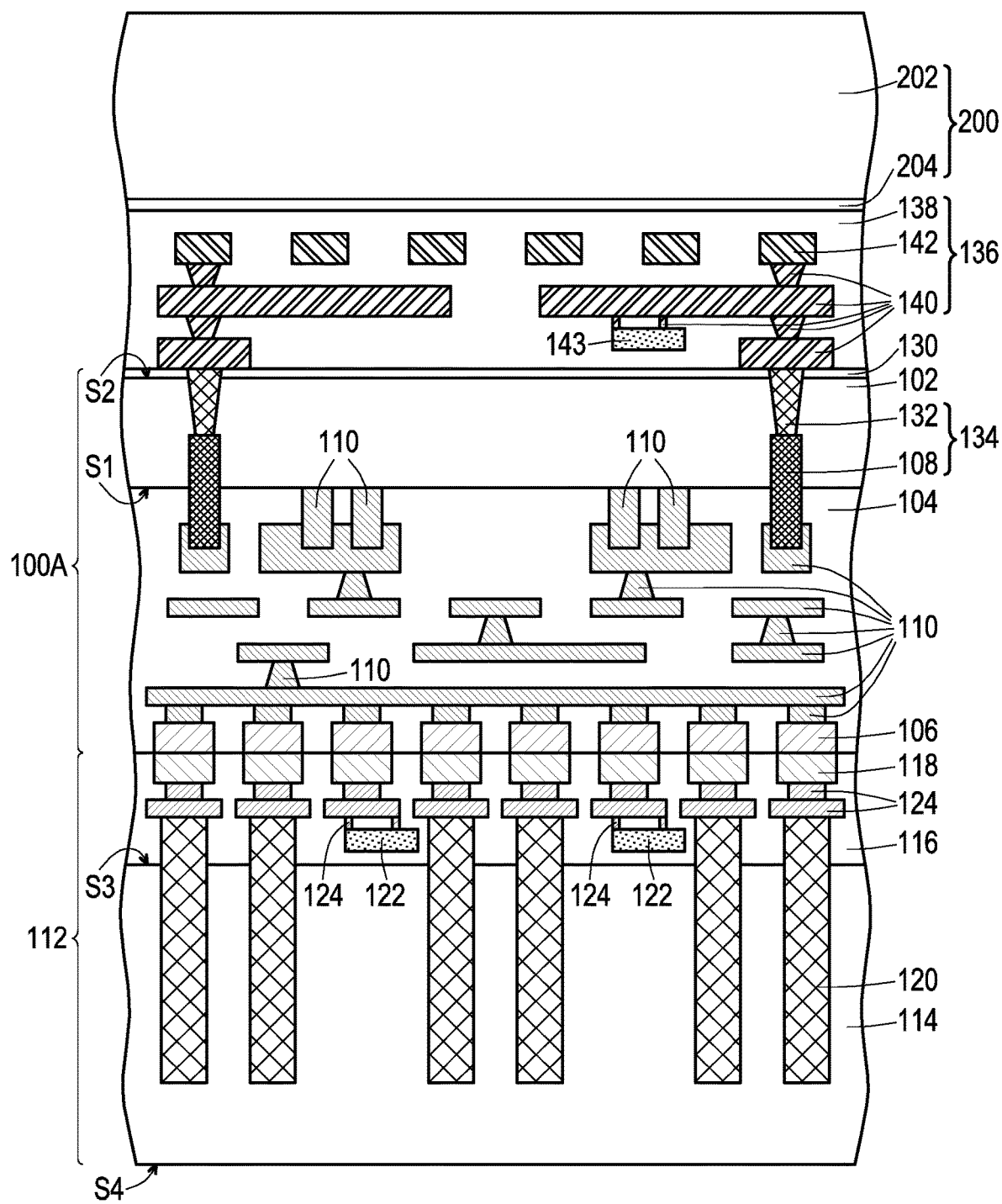
Figure 2D:
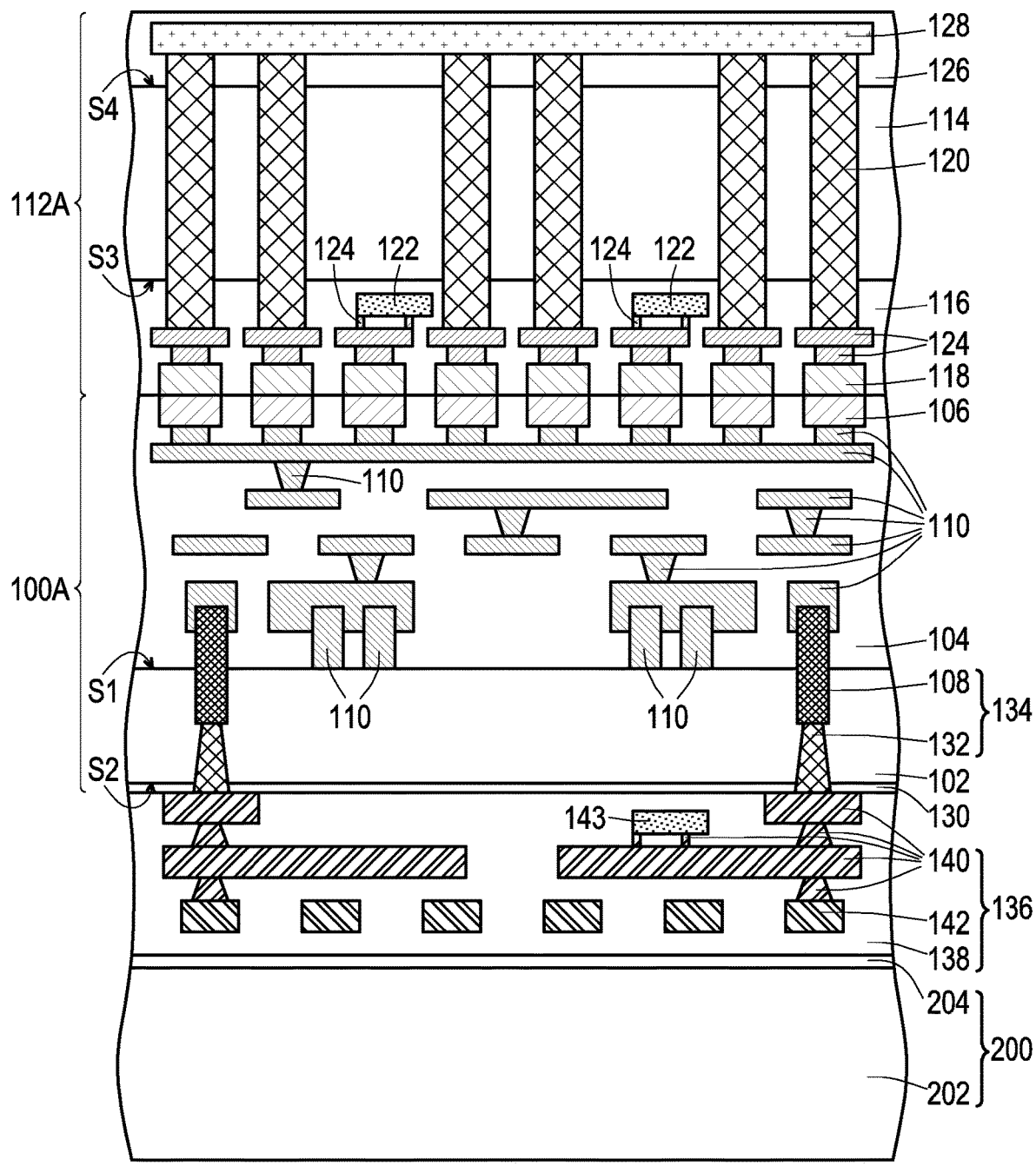
Figure 2E:
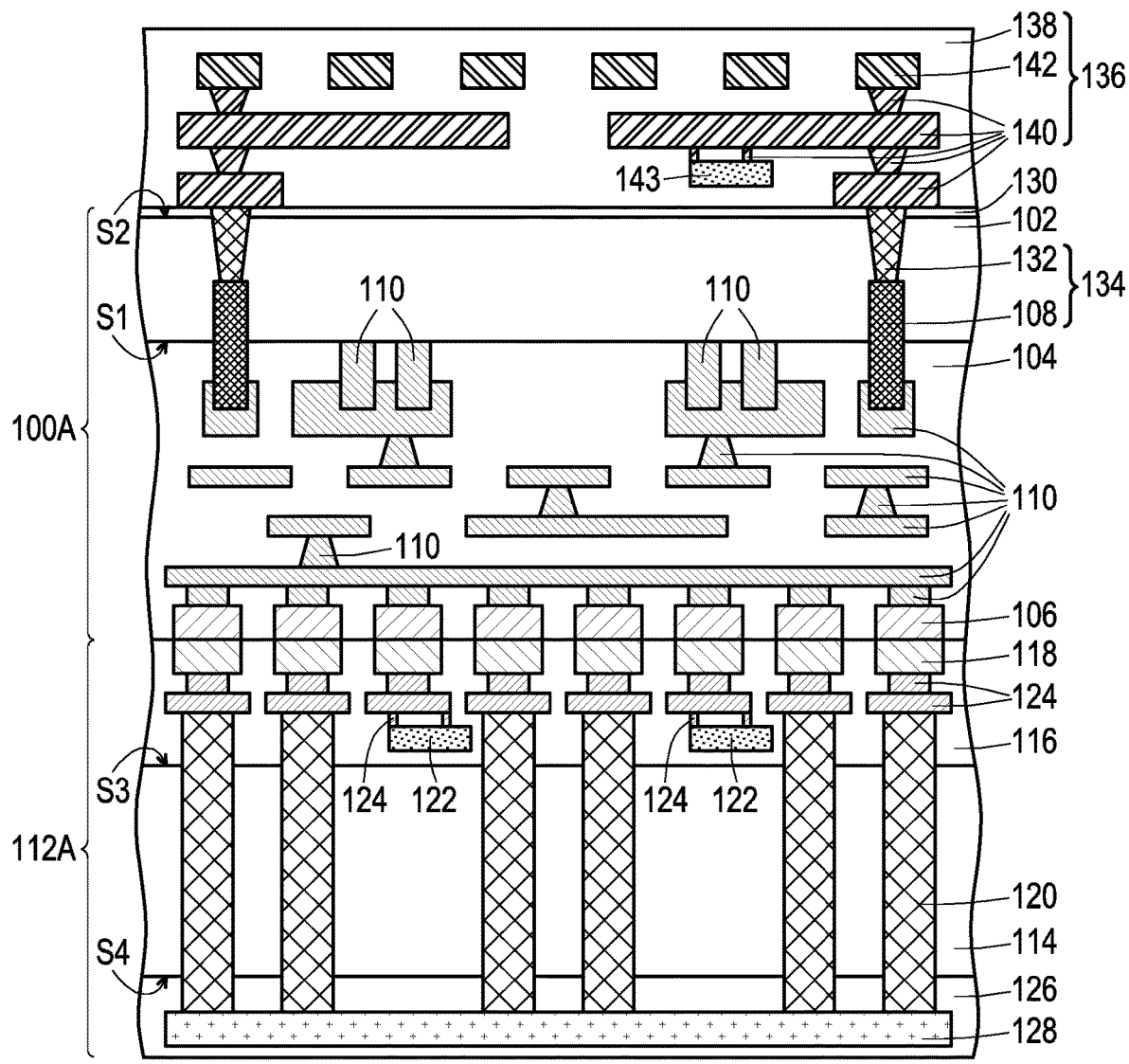
Figure 2F:
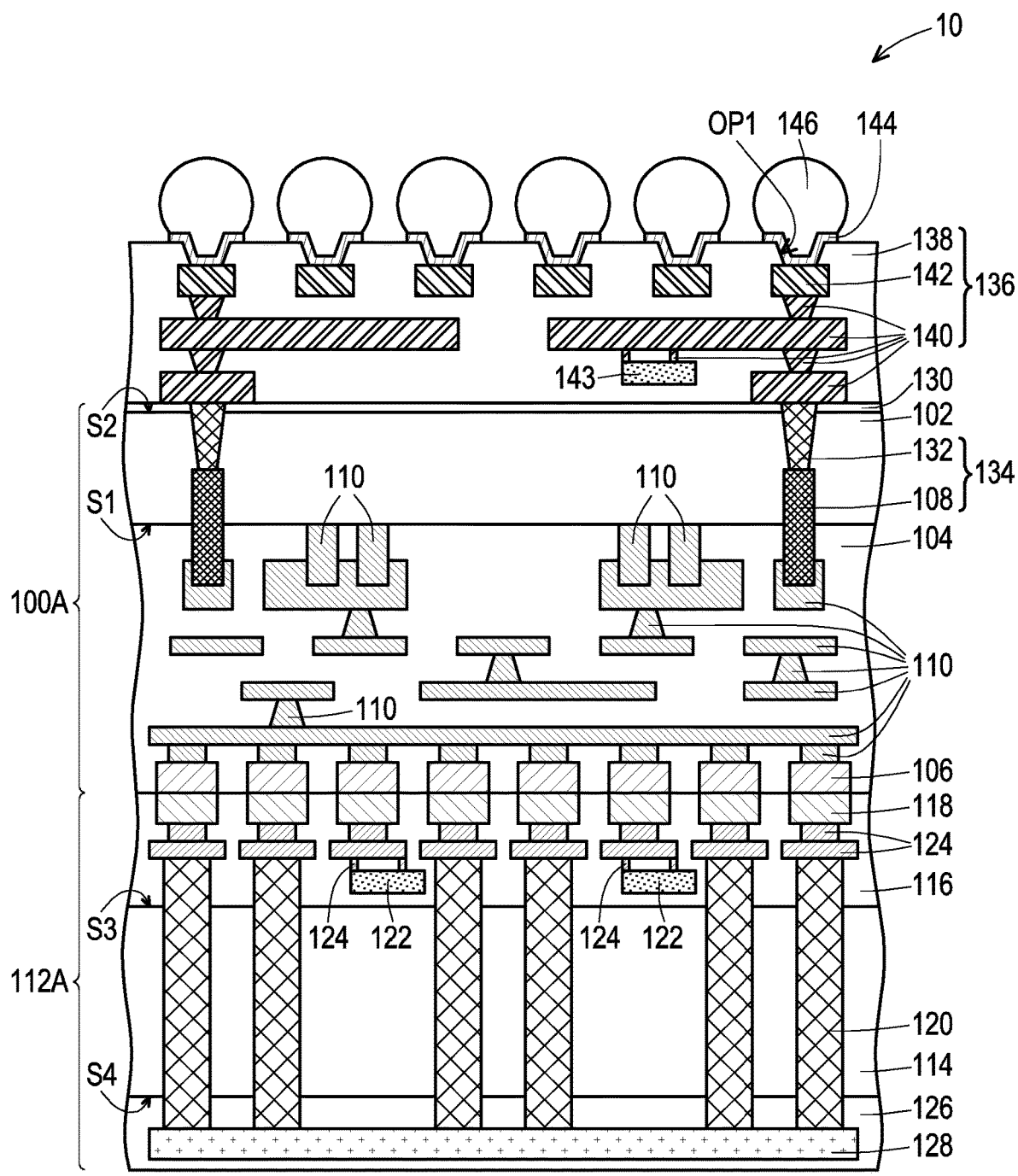
Figure 3:
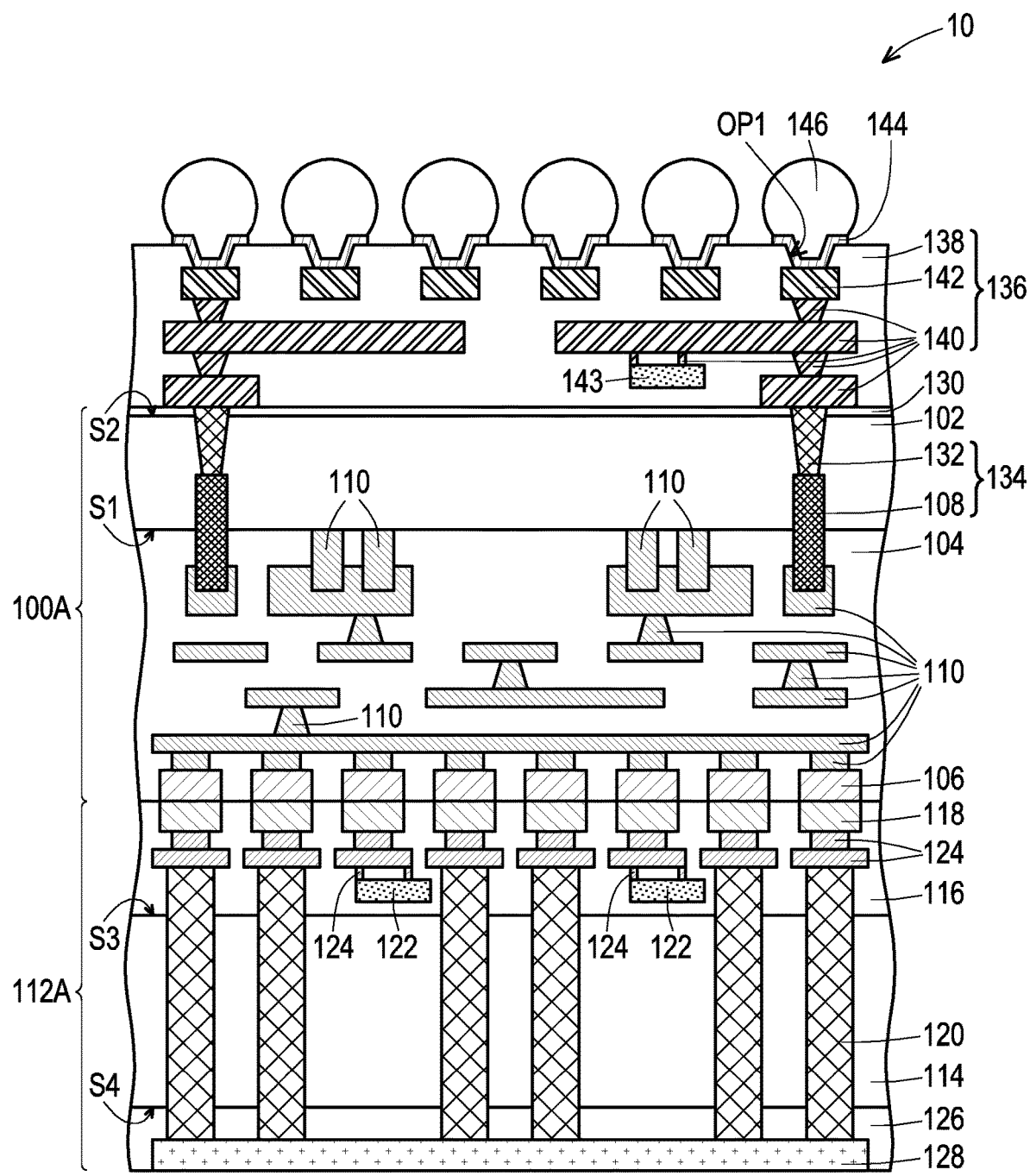
FIG. 3 to FIG. 5 are cross-sectional views of a semiconductor structure according to other embodiments of the invention.
Figure 4:
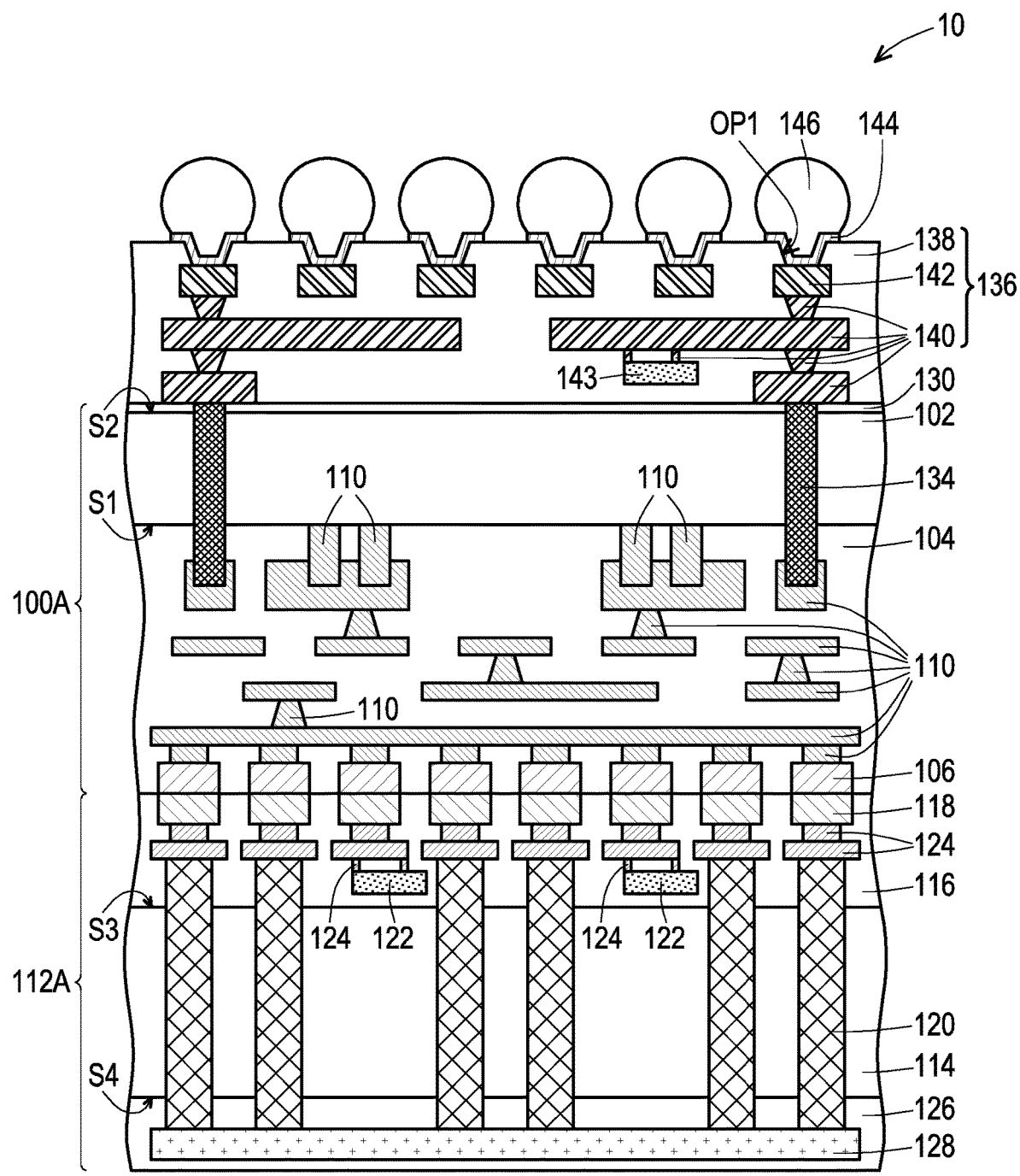
Figure 5:
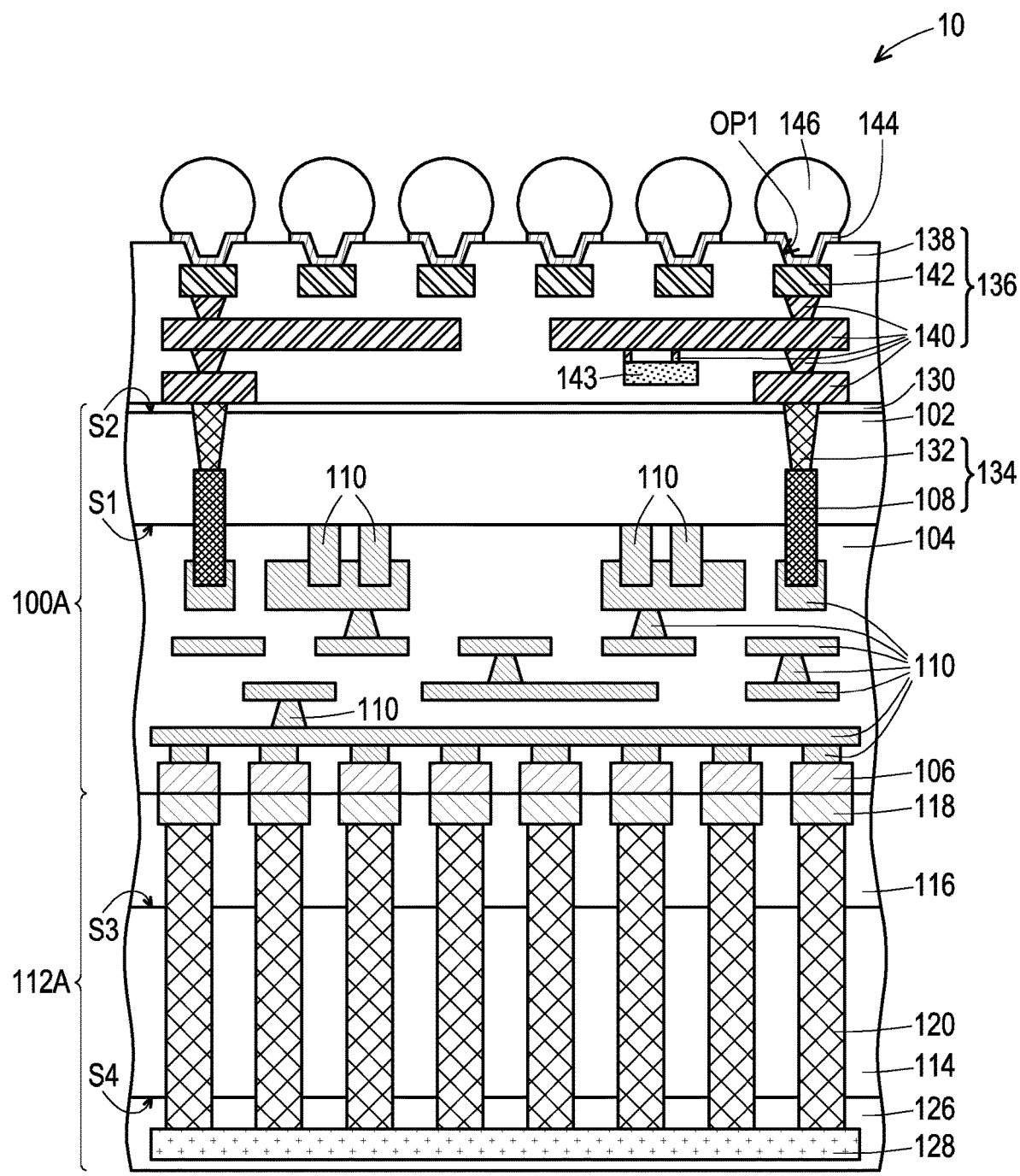

FIG. 1A to FIG. 1G are cross-sectional views of a manufacturing process of a semiconductor structure according to some embodiments of the invention. FIG. 2A to FIG. 2F are cross-sectional views of a manufacturing process of a semiconductor structure according to other embodiments of the invention. FIG. 2A to FIG. 2F are cross-sectional views of the manufacturing process following the step of FIG. 1C. FIG. 3 to FIG. 5 are cross-sectional views of a semiconductor structure according to other embodiments of the invention.

Figure 1A:
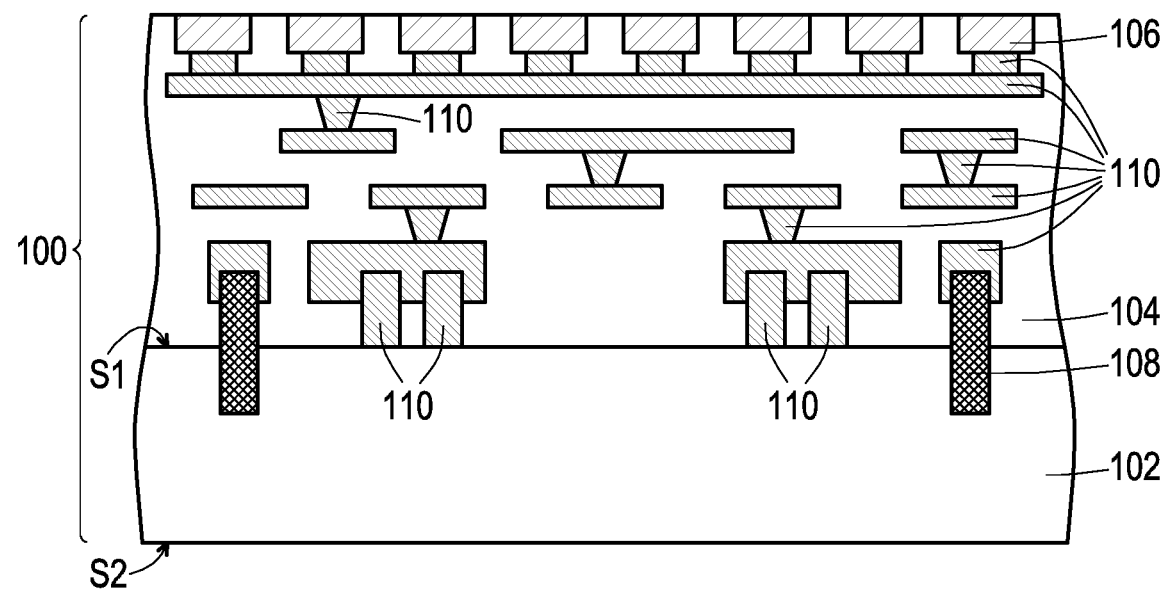
FIG. 1A to FIG. 1G are cross-sectional views of a manufacturing process of a semiconductor structure according to some embodiments of the invention.

Referring to FIG. 1A, a device wafer 100 may be provided. The device wafer 100 may include a substrate 102, a dielectric layer 104, bonding pads 106, and a via 108. The substrate 102 has a first surface S1 and a second surface S2 opposite to each other. In some embodiments, the first surface S1 may be the front side of the substrate 102, and the second surface S2 may be the back side of the substrate 102. The substrate 102 may be a semiconductor substrate such as a silicon substrate. In addition, although not shown in the figure, the substrate 102 may have required semiconductor devices (e.g., active device and/or passive device) thereon, and the description thereof is omitted here.

The dielectric layer 104 is located on the first surface S1. In some embodiments, dielectric layer 104 may be a multilayer structure. The material of the dielectric layer 104 may include silicon oxide, silicon nitride, or a combination thereof. The bonding pads 106 are located in the dielectric layer 104. The material of the bonding pad 106 may include copper, tantalum, tantalum nitride, or a combination thereof. The via 108 is located in the substrate 102 and the dielectric layer 104. The material of the via 108 may include tungsten, copper, tantalum, tantalum nitride, or a combination thereof.

In some embodiments, the device wafer 100 may further include an interconnect structure 110. The interconnect structure 110 is located in the dielectric layer 104. The interconnect structure 110 may be electrically connected to the via 108. The interconnect structure 110 may be electrically connected to the bonding pads 106. In some embodiments, the interconnect structure 110 may include a front end of line (FEOL) interconnect structure and a back end of line (BEOL) interconnect structure. The interconnect structure 110 may include a contact, a via, a conductive line, or a combination thereof. The material of the interconnect structure 110 may include copper, aluminum, tungsten, tantalum, tantalum nitride, titanium, titanium nitride, or a combination thereof. In addition, the quantity, shape, and arrangement of the interconnect structure 110 may be adjusted according to the requirement.

Figure 1B:
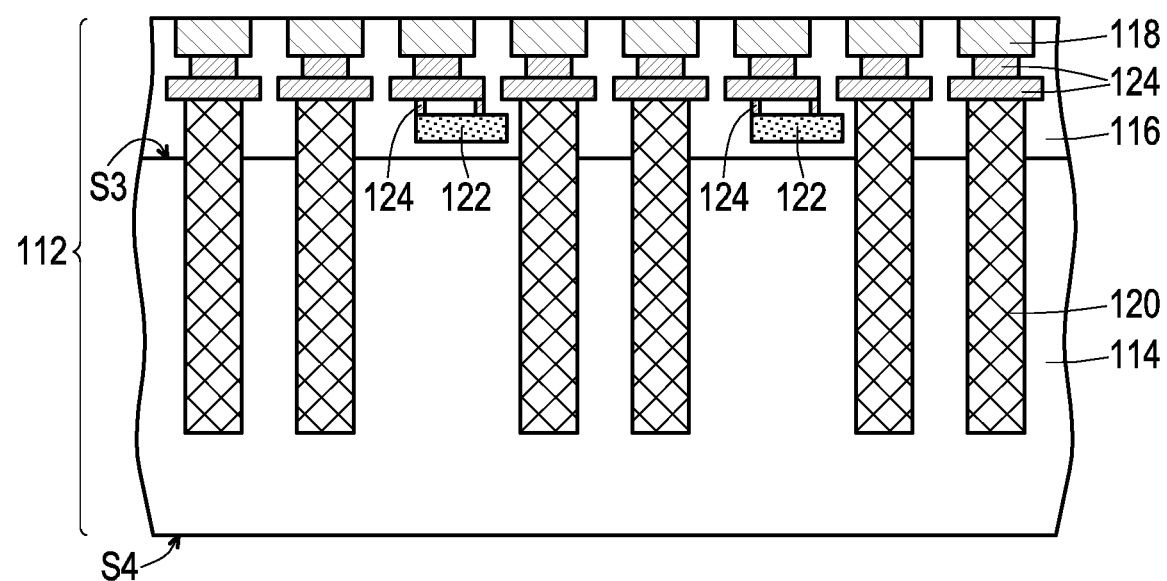

Referring to FIG. 1B, a carrier structure 112 may be provided. The carrier structure 112 includes a substrate 114, a dielectric layer 116, bonding pads 118, and TSVs 120. The substrate 114 has a third surface S3 and a fourth surface S4 opposite to each other. The substrate 114 may be a semiconductor substrate such as a silicon substrate. The dielectric layer 116 is located on the third surface S3. In some embodiments, the dielectric layer 104 may be a multilayer structure. The material of the dielectric layer 116 may include silicon oxide, silicon nitride, or a combination thereof.

The bonding pads 118 are located in the dielectric layer 116. The material of the bonding pad 106 may include copper, tantalum, tantalum nitride, or a combination thereof. The TSVs 120 are located in the substrate 114. In some embodiments, the TSVs 120 may be further located in the dielectric layer 116. Each of the TSVs 120 is electrically connected to the corresponding bonding pad 118. The material of the TSV 120 may include copper, tantalum, tantalum nitride, or a combination thereof.

In some embodiments, the carrier structure 112 may further include an integrated passive device 122. The integrated passive device 122 is located in the dielectric layer 116. In other embodiments, although not shown in the figure, the integrated passive device 122 may be further located in the substrate 114. The integrated passive device 122 may be electrically connected to one of the bonding pads 118. In some embodiments, the integrated passive device 122 may be a trench type passive device or a 3D cylinder type passive device. In some embodiments, the integrated passive device 122 may be a passive device such as a capacitor.

In some embodiments, the carrier structure 112 may further include an interconnect structure 124. The interconnect structure 124 is located in the dielectric layer 116. In addition, the interconnect structure 124 may be electrically connected to the TSV 120. Furthermore, the interconnect structure 124 may be electrically connected to the bonding pad 118. In the present embodiment, each of the TSVs 120 may be electrically connected to the corresponding bonding pad 118 by the interconnect structure 124. On the other hand, the interconnect structure 124 may be electrically connected to the integrated passive device 122. That is, each of the integrated passive devices 122 may be electrically connected to the corresponding bonding pad 118 by the interconnect structure 124. The interconnect structure 124 may include a contact, a via, a conductive line, or a combination thereof. The material of the interconnect structure 124 may include copper, aluminum, tungsten, tantalum, tantalum nitride, titanium, titanium nitride, or a combination thereof. Moreover, the quantity, shape, and arrangement of the interconnect structure 124 may be adjusted according to the requirement.

Figure 1C:
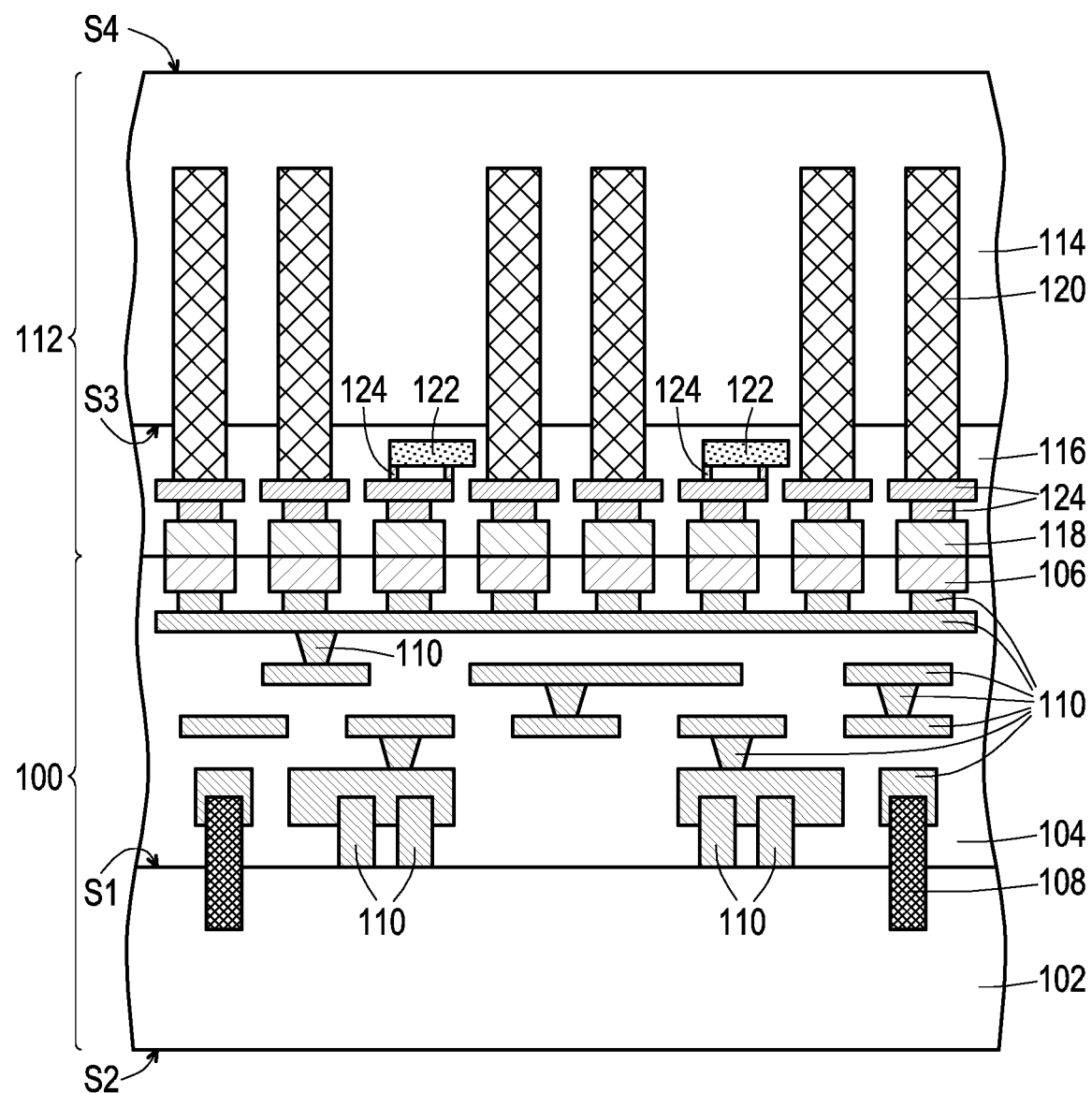

Referring to FIG. 1C, the bonding pads 118 may be bonded to the bonding pads 106, and the dielectric layer 116 may be bonded to the dielectric layer 104. In some embodiments, the method of bonding the bonding pads 118 to the bonding pad 106 and bonding the dielectric layer 116 to the dielectric layer 104 is, for example, a hybrid bonding method.

Figure 1D:
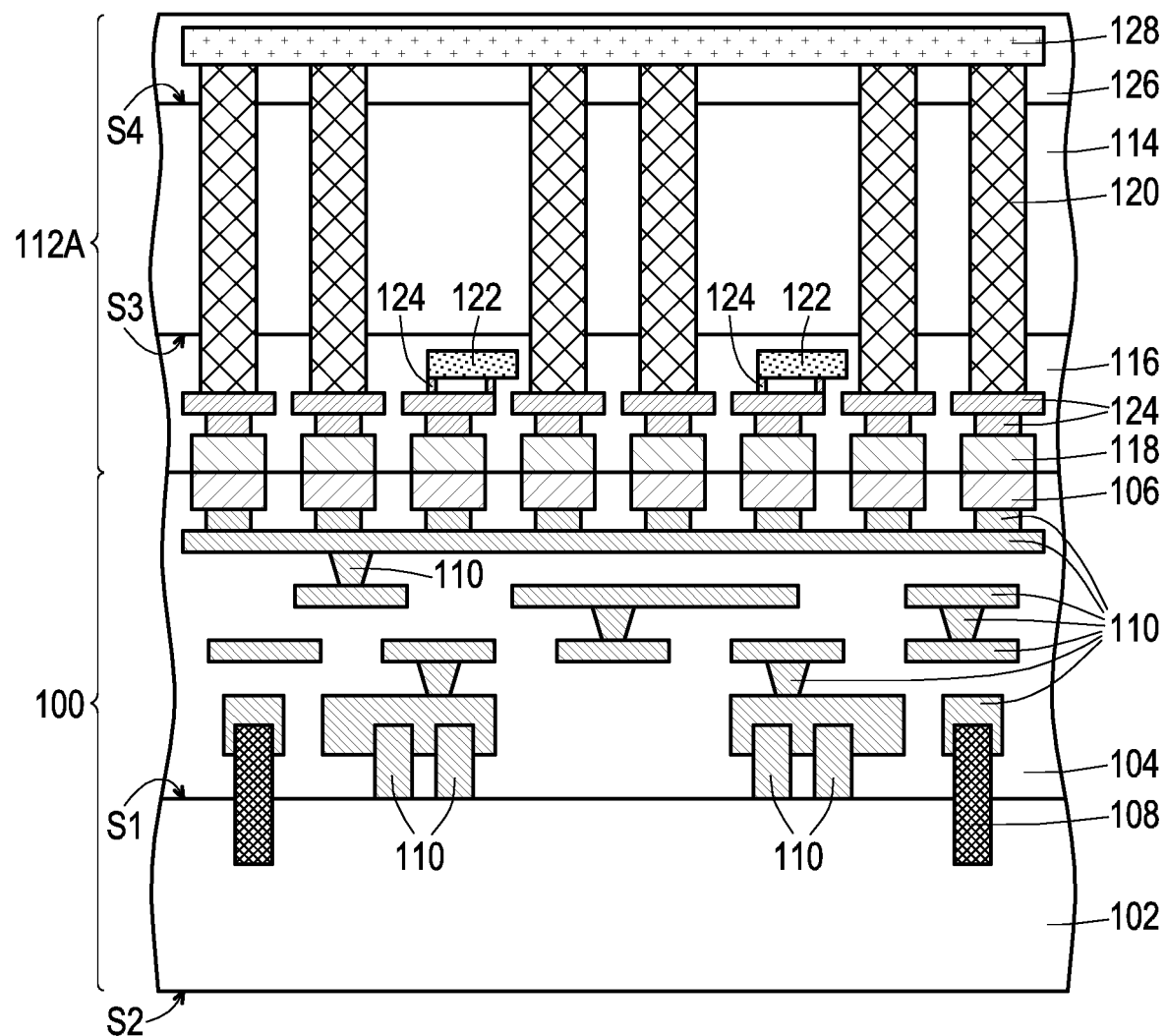

Referring to FIG. 1D, a portion of the substrate 114 may be removed from the fourth surface S4 to expose the TSV 120. Therefore, the TSV 120 may pass through the substrate 114. In some embodiments, the portion of the substrate 114 may be removed by a chemical mechanical polishing (CMP) process and an etch-back process.

A dielectric layer 126 and a heat dissipation plate 128 may be formed. The dielectric layer 126 and the heat dissipation plate 128 are located on the fourth surface S4. In some embodiments, the dielectric layer 126 may be a multilayer structure. The material of the dielectric layer 126 may include silicon oxide, silicon nitride, or a combination thereof. The heat dissipation plate 128 is located in the dielectric layer 126. The heat dissipation plate 128 may be electrically connected to the TSV 120. In addition, each of the TSVs 120 is electrically connected to the heat dissipation plate 128 and the corresponding bonding pad 118. The material of the heat dissipation plate 128 may include copper, tantalum, tantalum nitride, or a combination thereof. Furthermore, the dielectric layer 126 and the heat dissipation plate 128 may be fabricated by the conventional method, and the description thereof is omitted here.

By the above method, the carrier structure 112A may be formed on the first surface S1. The carrier structure 112A includes the substrate 114, the dielectric layer 116, the bonding pads 118, the heat dissipation plate 128 and the TSVs 120. In some embodiments, the carrier structure 112A may further include the integrated passive device 122 and the interconnect structure 124.

Figure 1E:
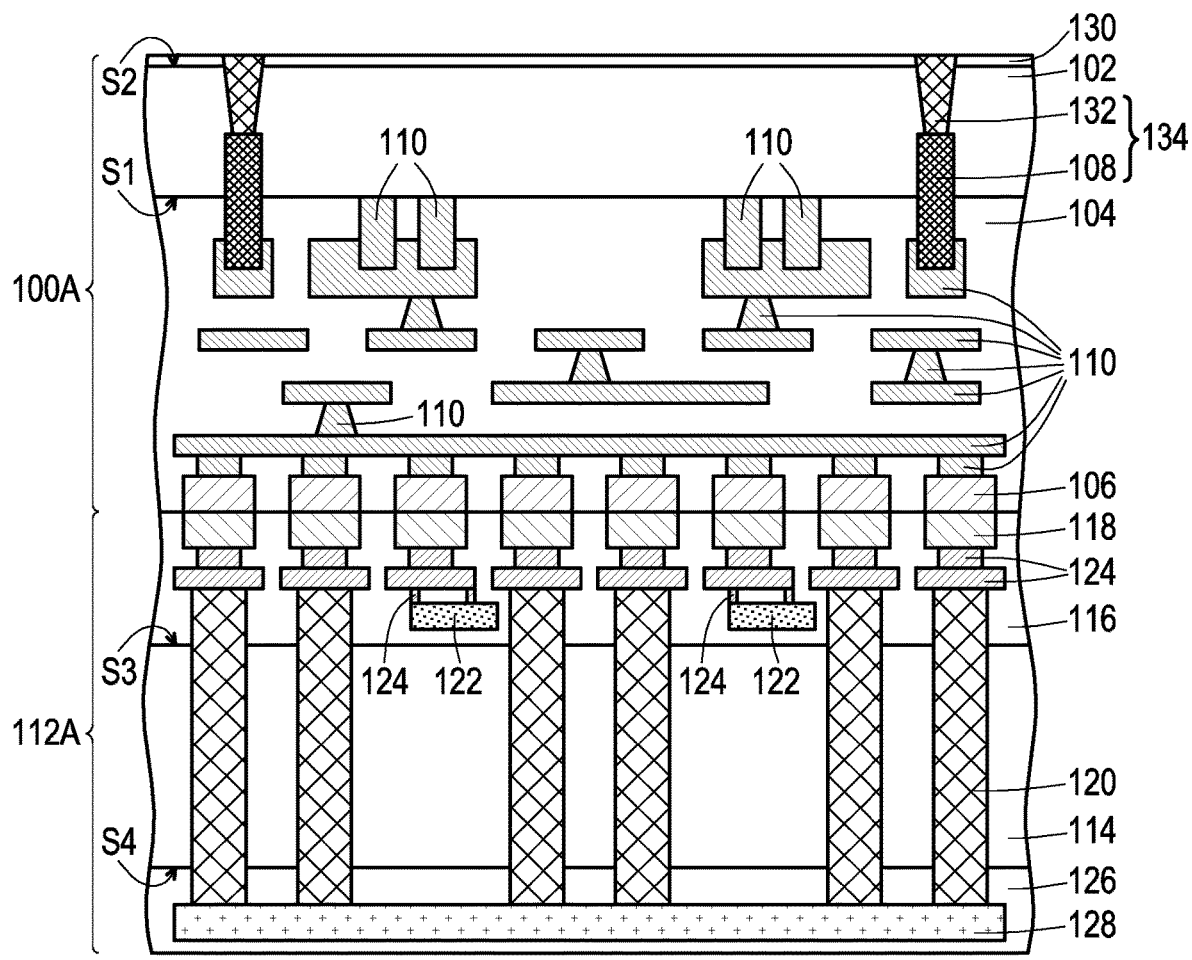

Referring to FIG. 1E, a thinning process may be formed on the substrate 102 from the second surface S2 to reduce the thickness of the substrate 102. In some embodiments, the thinning process may be a grinding process, a CMP process, or a combination thereof.

A dielectric layer 130 may be formed on the second surface S2. The material of the dielectric layer 130 may include silicon oxide. The method of forming the dielectric layer 130 is, for example, a chemical vapor deposition (CVD) method.

A via 132 may be formed in the dielectric layer 130 and the substrate 102. Therefore, the power via structure 134 may be formed. The power via structure 134 passes through the substrate 102. In the present embodiment, the power via structure 134 may include the via 108 and the via 132. That is, the power via structure 134 may be a multilayer structure, but the invention is not limited thereto. The via 132 may be electrically connected to the via 108. The material of the via 132 may include tungsten, copper, tantalum, tantalum nitride, or a combinations thereof. In some embodiments, the via 132 may be formed by a damascene process.

By the above method, the device wafer 100A may be formed. The device wafer 100A includes the substrate 102, the dielectric layer 104, the bonding pads 106, and the power via structure 134. In some embodiments, the device wafer 100A may further include the interconnect structure 110 and the dielectric layer 130.

Figure 1F:
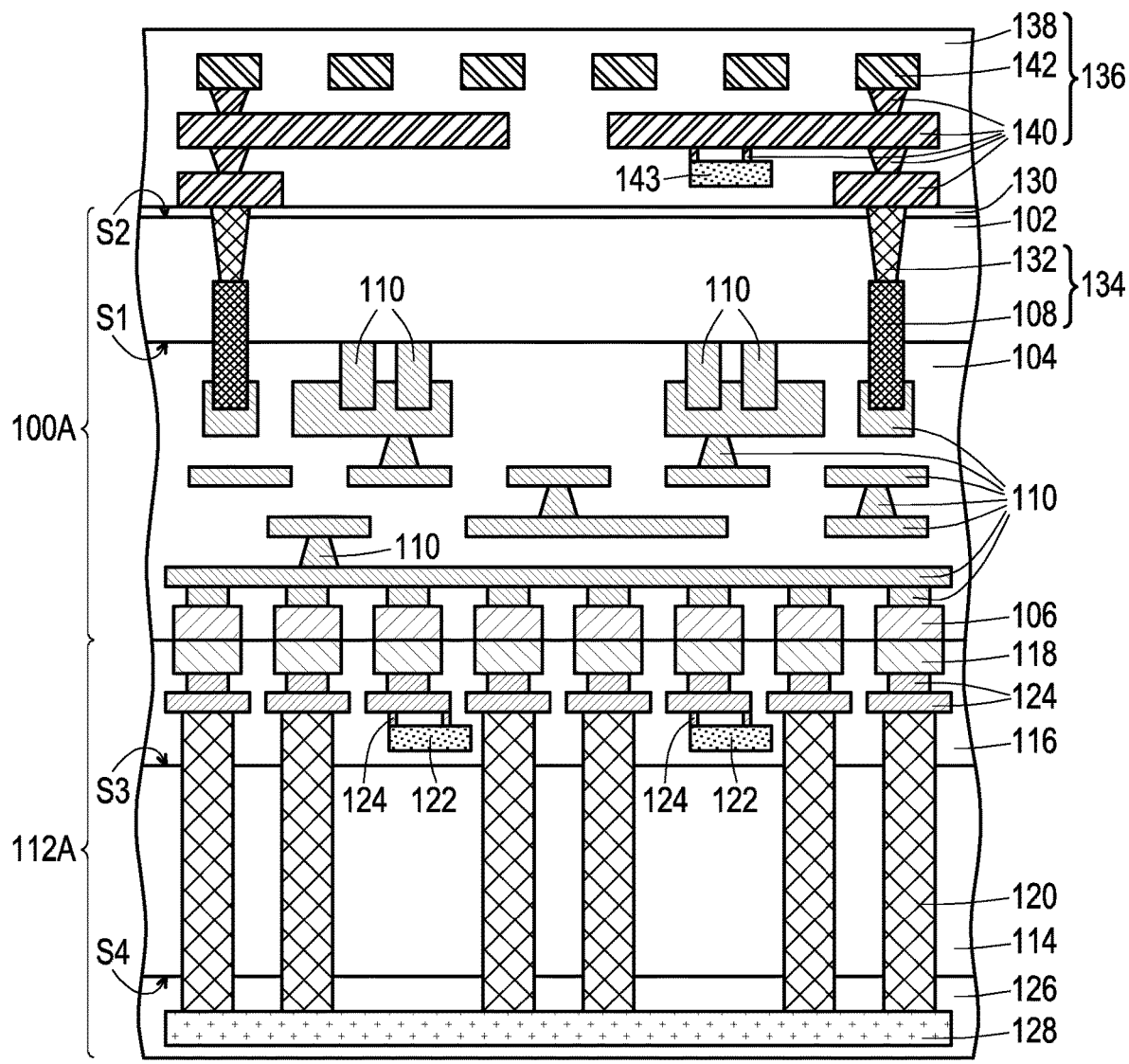

Referring to FIG. 1F, an RDL structure 136 is formed above the second surface S2. The RDL structure 136 is electrically connected to the power via structure 134. In some embodiments, the RDL structure 136 may be used as a backside power delivery network.

In some embodiments, the RDL structure 136 may include a dielectric layer 138, an RDL 140, a pad 142, and an integrated passive device 143. The dielectric layer 138 is located on the second surface S2. In some embodiments, the dielectric layer 138 may be located on the dielectric layer 130. The RDL 140 is located in the dielectric layer 138. The RDL 140 may be electrically connected to the power via structure 134. The material of the RDL 140 may include copper, tantalum, tantalum nitride, or a combination thereof. The pad 142 is located in the dielectric layer 138. The pad 142 may be electrically connected to the RDL 140. The material of the pad 142 may include a conductive material such as aluminum. The integrated passive device 143 is located in the dielectric layer 138. In other embodiments, although not shown in the figure, the integrated passive device 143 may be further located in the dielectric layer 130 and the substrate 102. The integrated passive device 143 may be electrically connected to the RDL 140. In some embodiments, the integrated passive device 143 may be a trench type passive device or a 3D cylinder type passive device. In some embodiments, the integrated passive device 143 may be a passive device such as a capacitor. The RDL structure 136 may be fabricated by the conventional method, and the description thereof is omitted here.

Figure 1G:
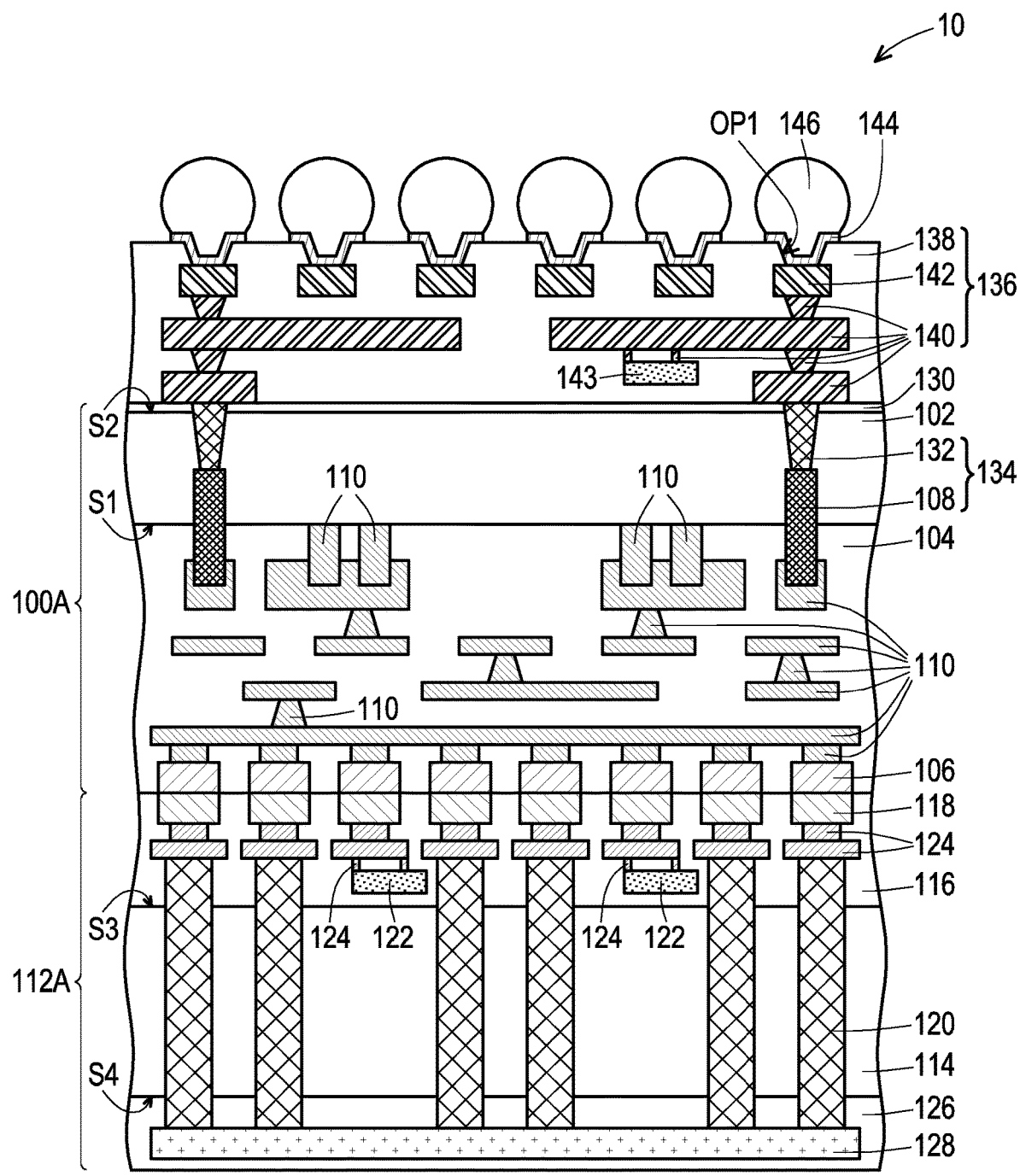

Referring to FIG. 1G, an opening OP1 may be formed in the dielectric layer 138. The opening OP1 may expose the pad 142. A UBM 144 may be formed in the opening OP1. The UBM 144 may be electrically connected to the pad 142. A connection terminal 146 may be formed on the RDL structure 136. In some embodiments, the connection terminal 146 may be formed on the UBM 144. The connection terminal 146 may be electrically connected to the pad 142. The connection terminal 146 may be a bump (e.g., solder ball), but the invention is not limited thereto.

In the present embodiment, the heat dissipation plate 128 may be formed first, and then the RDL structure 136 may be formed, but the invention is not limited thereto. In other embodiments, as shown in FIG. 2A to FIG. 2F, the RDL structure 136 may be formed first, and then the heat dissipation plate 128 may be formed. First, as shown in FIG. 2A, after forming the structure as shown in FIG. 1C, the steps as shown in FIG. 1E may be performed to form the dielectric layer 130 and the power via structure 134. Therefore, the device wafer 100A may be formed. As shown in FIG. 2B, the steps as shown in FIG. 1F may be performed to form the RDL structure 136 above the second surface S2. As shown in FIG. 2C, a carrier structure 200 may be bonded to the RDL structure 136, wherein the carrier structure 200 may include a substrate 202 and a dielectric layer 204. In some embodiments, the dielectric layer 204 of the carrier structure 200 may be bonded to the dielectric layer 138 of the RDL structure 136. As shown in FIG. 2D, the steps as shown in FIG. 1D may be performed to form the dielectric layer 126 and the heat dissipation plate 128. Therefore, the carrier structure 112A may be formed on the first surface S1. As shown in FIG. 2E, the carrier structure 200 may be removed. As shown in FIG. 2F, the steps as shown in FIG. 1G may be performed to form the UBM 144 and the connection terminal 146. In addition, in FIG. 1A to FIG. 1G and FIG. 2A to FIG. 2F, the same or similar components are denoted by the same reference symbols, and the description thereof is omitted here.

Hereinafter, the semiconductor structure 10 of the above embodiments will be described with reference to FIG. 1G. In addition, although the method for forming the semiconductor structure 10 is described by taking the above method as an example, the invention is not limited thereto.

Referring to FIG. 1G, the semiconductor structure 10 includes a device wafer 100A, a carrier structure 112A and an RDL structure 136. The device wafer 100A includes a substrate 102, a dielectric layer 104, bonding pads 106, and a power via structure 134. The substrate 102 has a first surface S1 and a second surface S2 opposite to each other. The dielectric layer 104 is located on the first surface S1. The bonding pads 106 are located in the dielectric layer 104. The power via structure 134 passes through the substrate 102. The device wafer 100A may further include an interconnect structure 110 and a dielectric layer 130. The interconnect structure 110 is located in the dielectric layer 104. In addition, the interconnect structure 110 may be electrically connected to the power via structure 134. Furthermore, the interconnect structure 110 may be electrically connected to the bonding pads 106. The dielectric layer 130 may be located on the second surface S2.

The carrier structure 112A includes a substrate 114, a dielectric layer 116, bonding pads 118, a heat dissipation plate 128, and TSVs 120. The substrate 114 has a third surface S3 and a fourth surface S4 opposite to each other. The dielectric layer 116 is located on the third surface S3. The bonding pads 118 are located in the dielectric layer 116. The bonding pads 118 are bonded to the bonding pads 106, and the dielectric layer 116 is bonded to the dielectric layer 104. The heat dissipation plate 128 is located on the fourth surface S4. Therefore, the heat dissipation performance of the semiconductor structure 10 can be effectively improved by the heat dissipation plate 128. In some embodiments, the heat dissipation plate 128 can be used as a power line, thereby improving the circuit design flexibility and the circuit performance. The TSVs 120 pass through the substrate 114. Each of the TSVs 120 is electrically connected to the heat dissipation plate 128 and the corresponding bonding pad 118. In some embodiments, the TSVs 120 may be directly connected to the heat dissipation plate 128.

In some embodiments, the carrier structure 112A may further include an integrated passive device 122, thereby improving the performance of the power circuit. The integrated passive device 122 is located in the dielectric layer 116. In other embodiments, although not shown in the figure, the integrated passive device 122 may be further located in the substrate 114. The integrated passive device 122 may be electrically connected to one of the bonding pads 118. In some embodiments, the carrier structure 112 may further include an interconnect structure 124. The interconnect structure 124 is located in the dielectric layer 116. In addition, the interconnect structure 124 may be electrically connected to the TSV 120. Furthermore, the interconnect structure 124 may be electrically connected to the bonding pad 118. On the other hand, the interconnect structure 124 may be electrically connected to the integrated passive device 122. In some embodiments, the carrier structure 112A may further include a dielectric layer 126. The dielectric layer 126 is located on the fourth surface S4. The heat dissipation plate 128 may be located in the dielectric layer 126.

The RDL structure is 136 is located on the second surface S2. In some embodiments, RDL structure 136 may be located on dielectric layer 130. The RDL structure 136 is electrically connected to the power via structure 134. The RDL structure 136 may include a dielectric layer 138, an RDL 140, a pad 142, and an integrated passive device 143. The dielectric layer 138 is located on the second surface S2. In some embodiments, the dielectric layer 138 may be located on the dielectric layer 130. The RDL 140 is located in the dielectric layer 138. The RDL 140 may be electrically connected to the power via structure 134. The pad 142 is located in the dielectric layer 138. The pad 142 may be electrically connected to the RDL 140. The integrated passive device 143 is located in the dielectric layer 138. In other embodiments, although not shown in the figure, the integrated passive device 143 may be further located in the dielectric layer 130 and the substrate 102. The integrated passive device 143 may be electrically connected to the RDL 140.

In some embodiments, the semiconductor structure 10 may further include a connection terminal 146. The connection terminal 146 is located on the RDL structure 136. The connection terminal 146 may be electrically connected to the pad 142. In some embodiments, the semiconductor structure 10 may further include a UBM 144. The UBM 144 is located between the connection terminal 146 and the pad 142.

In the present embodiment, as shown in FIG. 1G, the dielectric layer 126 may completely cover the heat dissipation plate 128, but the invention is not limited thereto. In other embodiments, as shown in FIG. 3, the dielectric layer 126 may expose the heat dissipation plate 128, thereby further improving the heat dissipation performance of the semiconductor structure 10.

In the present embodiment, as shown in FIG. 1G, the power via structure 134 may be a multilayer structure, but the invention is not limited thereto. In other embodiments, as shown in FIG. 4, the power via structure 134 may be a single-layer structure.

In the present embodiment, as shown in FIG. 1G, each of the TSVs 120 may be electrically connected to the corresponding bonding pad 118 by the interconnect structure 124, but the invention is not limited thereto. In other embodiments, as shown in FIG. 5, the TSVs 120 may be directly connected to the bonding pads 118. Furthermore, as shown in FIG. 5, the interconnect structure 124 may be omitted.

In the present embodiment, as shown in FIG. 1G, the carrier structure 112 may include the integrated passive device 122, but the invention is not limited thereto. In other embodiments, as shown in FIG. 5, the integrated passive device 122 may be omitted.

In addition, the remaining components in the semiconductor structure 10 may refer to the descriptions of the above-mentioned embodiments. Furthermore, the details of the components in the semiconductor structure 10 (e.g., materials and forming methods) have been described in detail in the above-mentioned embodiments, and the description thereof is omitted here. On the other hand, in FIG. 1G and FIG. 3 to FIG. 5, the same or similar components are denoted by the same reference symbols, and the description thereof is omitted here.

Based on the above embodiments, in the semiconductor structure 10 and the manufacturing method thereof, the bonding pads 118 are bonded to the bonding pads 106, the TSVs 120 pass through the substrate 114, and each of the TSVs 120 is electrically connected to the heat dissipation plate 128 and the corresponding bonding pad 118. Therefore, the heat dissipation performance of the semiconductor structure 10 can be effectively improved by the heat dissipation plate 128. In some embodiments, the heat dissipation plate 128 can be used as a power line, thereby improving the circuit design flexibility and the circuit performance.

In summary, in the semiconductor structure and the manufacturing method thereof of the aforementioned embodiments, since the carrier structure includes bonding pads, a heat dissipation plate, and TSVs, the heat dissipation performance, circuit design flexibility, and circuit performance of the semiconductor structure can be effectively improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
   a device wafer comprising:
      a first substrate having a first surface and a second surface opposite to each other;
      a first dielectric layer located on the first surface;
      first bonding pads located in the first dielectric layer; and
      a power via structure passing through the first substrate;
   a carrier structure comprising:
      a second substrate having a third surface and a fourth surface opposite to each other;
      a second dielectric layer located on the third surface;
      second bonding pads located in the second dielectric layer, wherein the second bonding pads are bonded to the first bonding pads, and the second dielectric layer is bonded to the first dielectric layer;
      a heat dissipation plate located on the fourth surface; and
      through-substrate vias (TSVs) passing through the second substrate, wherein each of the TSVs is electrically connected to the heat dissipation plate and the corresponding second bonding pad; and
   a redistribution layer (RDL) structure located on the second surface, wherein the RDL structure is electrically connected to the power via structure.

2. The semiconductor structure according to claim 1, wherein the carrier structure further comprises:
   an integrated passive device located in the second dielectric layer and electrically connected to one of the second bonding pads.

3. The semiconductor structure according to claim 1, wherein the carrier structure further comprises:
   a third dielectric layer located on the fourth surface, wherein the heat dissipation plate is located in the third dielectric layer.

4. The semiconductor structure according to claim 3, wherein the third dielectric layer completely covers the heat dissipation plate.

5. The semiconductor structure according to claim 3, wherein the third dielectric layer exposes the heat dissipation plate.

6. The semiconductor structure according to claim 1, wherein the power via structure comprises a multilayer structure.

7. The semiconductor structure according to claim 1, wherein the power via structure comprises a single-layer structure.

8. The semiconductor structure according to claim 1, wherein the TSVs are directly connected to the heat dissipation plate.

9. The semiconductor structure according to claim 1, wherein the TSVs are directly connected to the second bonding pads.

10. The semiconductor structure according to claim 1, wherein the device wafer further comprises:
    an interconnect structure located in the first dielectric layer, wherein the interconnect structure is electrically connected to the power via structure, and the interconnect structure is electrically connected to the first bonding pads.

11. The semiconductor structure according to claim 1, wherein the RDL structure comprises:
    a third dielectric layer located on the second surface;

an RDL located in the third dielectric layer and electrically connected to the power via structure;
a pad located in the third dielectric layer and electrically connected to the RDL; and
an integrated passive device located in the third dielectric layer and electrically connected to the RDL.

12. The semiconductor structure according to claim 11, further comprising:
a connection terminal located on the RDL structure and electrically connected to the pad.

13. The semiconductor structure according to claim 12, further comprising:
an under-bump metallurgy located between the connection terminal and the pad.

14. A manufacturing method of a semiconductor structure, comprising:
forming a device wafer, wherein the device wafer comprises:
a first substrate having a first surface and a second surface opposite to each other;
a first dielectric layer located on the first surface;
first bonding pads located in the first dielectric layer; and
a power via structure passing through the first substrate;
forming a carrier structure above the first surface, wherein the carrier structure comprises:
a second substrate having a third surface and a fourth surface opposite to each other;
a second dielectric layer located on the third surface;
second bonding pads located in the second dielectric layer, wherein the second bonding pads are bonded to the first bonding pads, and the second dielectric layer is bonded to the first dielectric layer;
a heat dissipation plate located on the fourth surface; and
TSVs passing through the second substrate, wherein each of the TSVs is electrically connected to the heat dissipation plate and the corresponding second bonding pad; and
forming an RDL structure above the second surface, wherein the RDL structure is electrically connected to the power via structure.

15. The manufacturing method of the semiconductor structure according to claim 14, wherein the carrier structure further comprises:
an integrated passive device located in the second dielectric layer and electrically connected to one of the second bonding pads.

16. The manufacturing method of the semiconductor structure according to claim 14, wherein a method of bonding the second bonding pads to the first bonding pads and bonding the second dielectric layer to the first dielectric layer comprises a hybrid bonding method.

17. The manufacturing method of the semiconductor structure according to claim 14, wherein the heat dissipation plate is formed first, and then the RDL structure is formed.

18. The manufacturing method of the semiconductor structure according to claim 14, wherein the RDL structure is formed first, and then the heat dissipation plate is formed.

19. The manufacturing method of the semiconductor structure according to claim 14, wherein the RDL structure comprises:
a third dielectric layer located on the second surface;
an RDL located in the third dielectric layer and electrically connected to the power via structure;
a pad located in the third dielectric layer and electrically connected to the RDL; and
an integrated passive device located in the third dielectric layer and electrically connected to the RDL.

20. The manufacturing method of the semiconductor structure according to claim 19, further comprising:
forming a connection terminal on the RDL structure, wherein the connection terminal is electrically connected to the pad.

* * * * *